(12) United States Patent
Smith (10) Patent No.: US 6,751,752 B1
(45) Date of Patent: Jun. 15, 2004

(54) CHECKING EVENTS GENERATED BY A DEVICE

(75) Inventor: Michael D. Smith, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 481 days.

(21) Appl. No.: 09/654,443

(22) Filed: Sep. 1, 2000

(51) Int. Cl.[7] ............................ G06F 11/00; G06F 17/50

(52) U.S. Cl. ............................. 714/39; 716/4; 716/5

(58) Field of Search ...................... 714/39; 716/4, 716/5

(56) References Cited

U.S. PATENT DOCUMENTS

| | | | |
|---|---|---|---|
| 6,175,946 B1 | * | 1/2001 | Ly et al. .................. 716/4 |
| 6,292,765 B1 | * | 9/2001 | Ho et al. .................. 703/14 |
| 6,332,201 B1 | * | 12/2001 | Chin et al. ................ 714/28 |
| 6,539,523 B1 | * | 3/2003 | Narain et al. ............... 716/5 |

* cited by examiner

*Primary Examiner*—Robert Beausoliel
*Assistant Examiner*—Emerson Puente
(74) *Attorney, Agent, or Firm*—Fish & Richardson, PC (57) ABSTRACT

A method of checking includes establishing links between events based on a set of event relationships, in an earlier pass through a time-ordered sequence of events, and checking whether the events comply with a set of rules based on the links, in a later pass through the sequence of events. The earlier pass and the later pass may be concurrent, with the earlier pass leading the later pass in the sequence of events.

24 Claims, 10 Drawing Sheets

A MEMREAD on a PCI bus that is DSRT is related to a subsequent successful MEMREAD on the PCI bus to the same ADDRESS. Similarly, a MMRDLIN on a PCI bus that is DSRT is related to a subsequent successful MMRDLIN on the PCI bus to the same ADDRESS.
⎩80

Any event on the front-side bus that is deferred with a certain DID is related to a subsequent DEFRRPLY on the front-side bus that has bits 16-23 of the ADDRESS field equal to the DID
⎩82

A MEMREAD to an address associated with SDRAM on a PCI bus is related to a subsequent MEMRDZL to the same ADDRESS on the front-side bus.
⎩83

A MEMWRIT to an address associated with SDRAM on a PCI bus is related to a subsequent RDINVZL to the same ADDRESS on the front-side bus.
⎩84

A MMRDLIN to an address associated with SDRAM on a PCI bus is related to a subsequent MEMRDZL to the same ADDRESS on the front-side bus and to a subsequent MEMRDZL to a subsequent ADDRESS.
⎩85.

A MEMREAD, MEMWRIT, or MMRDLIN on a PCI bus that is not DSRT is related to subsequent data transfers.
⎩86

FIG. 4A  78

Annotate every MEMRDZL event to a certain address with contents of the SDRAM image corresponding to that address at the start time of the MEMRDZL event.
88

Annotate every MEMREAD, MEMWRIT, or MMRDLIN with information on the destination device.
89

Every SLTR corresponding to a DSRT transaction on the PCI bus eventually succeeds. 302

Every DEFR transaction on the front-side bus receives a DEFRRPLY. 303

Every DEFRRPLY on the front-side bus corresponds to a DEFR transaction. 304

Every MMRDLIN on the PCI bus to an address associated with SDRAM causes two MEMRDZL on the front-side bus. 306

Every MEMWRIT on the PCI bus to an address associated with SDRAM causes a RDINVZL on the front-side bus. 308

Every MMRDLIN or MEMREAD on the PCI bus to an address associated with SDRAM receives correct data. 309

CHECKING EVENTS GENERATED BY A DEVICE

TECHNICAL FIELD

This invention relates to checking events generated by a device.

BACKGROUND

Many devices are required to respond to a set of inputs by performing a series of functions in a predetermined order or sequence, thereby generating a series of conditions. For example, a chipset (or any other device) connected to a bus in a computer system may respond to certain conditions on the bus by performing certain functions. The performed functions may, in turn, result in other conditions on the same bus or even on a different bus.

The operations of the chipset may be monitored or checked based on the time-ordered sequence of conditions on the buses. For example, the operations of the chipset may be checked to see if the chipset meets certain design requirements. In checking the operations of the chipset, related conditions that are of interest to the checker may be grouped together as an event, which may be associated with a start time and a finish time.

DESCRIPTION OF DRAWINGS

Like reference symbols in the various drawings indicate like elements.

DETAILED DESCRIPTION

Figure 1A:
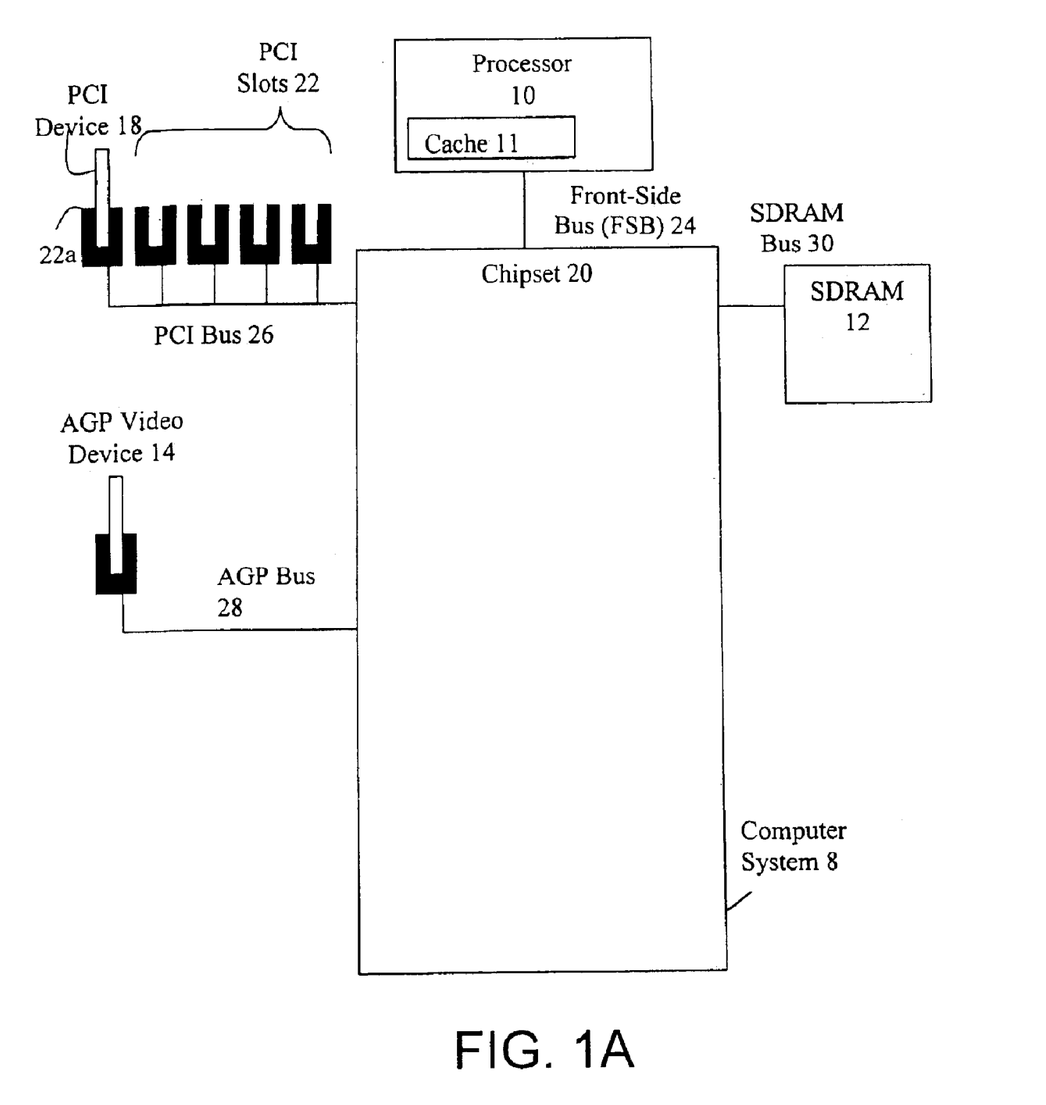
FIG. 1A is a block diagram of a computer system that includes a chipset.

Referring to FIG. 1A, a computer system 8 includes a computer processor 10, such as an Intel® Itanium® or Intel® Celeron® processor, which includes a cache 11 for storing data that is being processed by the processor 10 so that the data is rapidly accessible. The computer processor communicates with synchronous dynamic random access memory (SDRAM) 12, an advanced graphics port (AGP) video device 14, and a PCI device 18 through a chipset 20. The chipset 20 may be a 460GX chipset from Intel Corporation. The chipset 20 communicates with the processor 10 through a front-side bus (FSB) 24, the AGP video device 14 through an AGP bus 28, and SDRAM 12 through an SDRAM bus 30. The chipset 20 also communicates with the PCI device 18 through a PCI bus 26. The PCI device 18 is plugged into a slot 22a of the PCI bus 26. It may be necessary to test the chipset 20, for example, to ensure that it meets certain design requirements. For instance, a series of tests may be run on the chipset to check it.

Chipset 20 is tested using a sequence of inputs, or events, from the processor 10 and the PCI device 18 which are communicated to the chipset 20 on the front-side bus 24 and the PCI bus 26, respectively. The chipset 20 responds to the sequence of input events with corresponding output events on the two buses. By examining the events on the front-side bus 24 and on the PCI bus 26 during a test sequence, one can determine whether the chipset 20 is operating correctly.

More specifically, the events on the two buses are recorded in tracker files, which are examined by a checker program to determine whether the chipset is operating correctly.

Figure 1B:
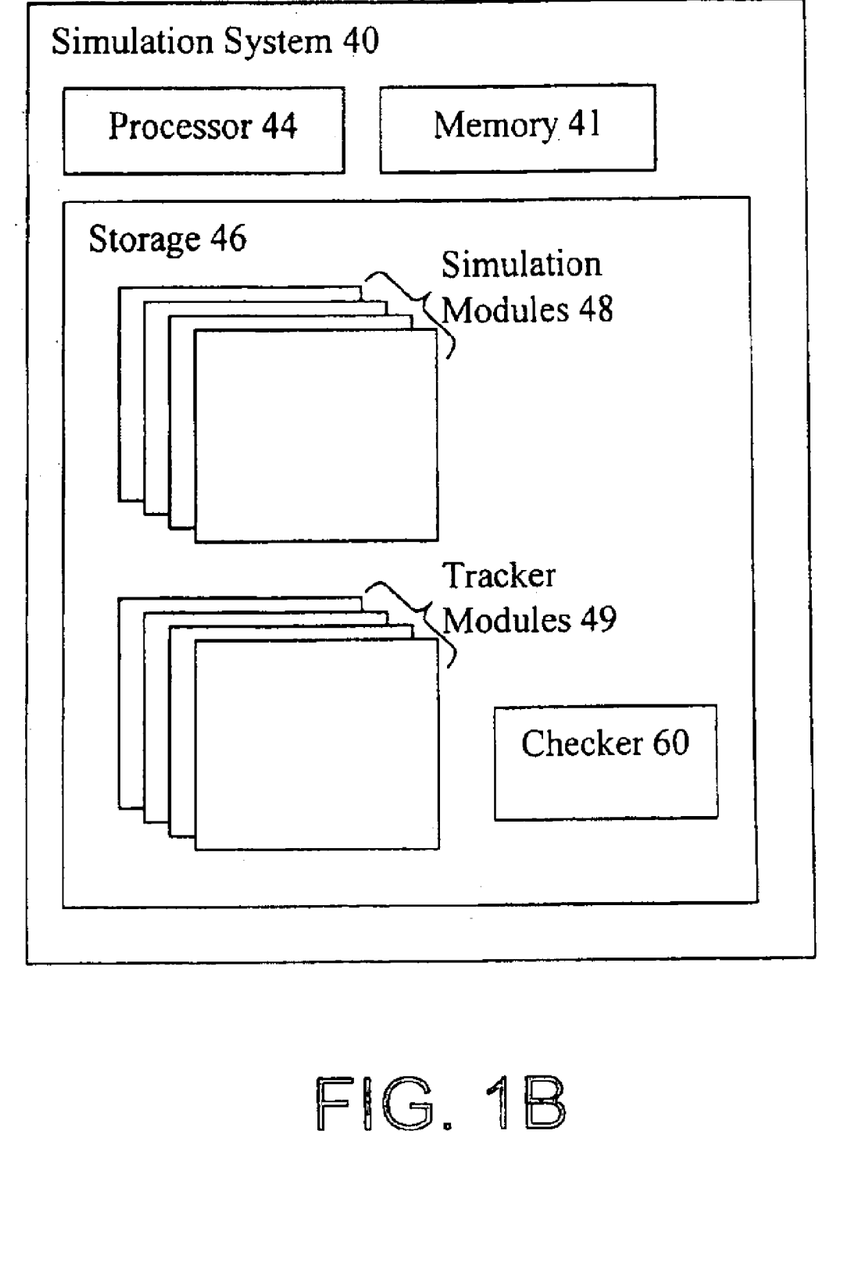
FIG. 1B is a block diagram of a computer system for simulating, tracking, and checking the design of the chipset of FIG. 1A.

Alternatively, referring to FIG. 1B, a software simulation of the chipset 20 (FIG. 1A) may be executed on a simulation system 40 to detect errors in the design of the chipset 20 even before the chipset 20 is manufactured. The simulation system 40 includes a memory 41 associated with a processor 44 for executing the software simulation. The simulation software is stored within a storage subsystem 46 associated with the processor 44. Storage subsystem 46 is a computer-readable medium that may include a CDROM, a floppy disk, a hard disk, a hard disk array, a memory, etc. The simulation software is loaded into memory 41 and executed by the processor 44.

The simulation software may include simulation modules 48 that simulate the various components of the computer system 8 (FIG. 1A). The simulation software also includes tracker modules 49 that collect data from the simulated components and, for example, store the data in tracker files. A checker system 60 checks the tracker files to determine whether or not the simulated chipset 20 is operating correctly.

Figure 1C:
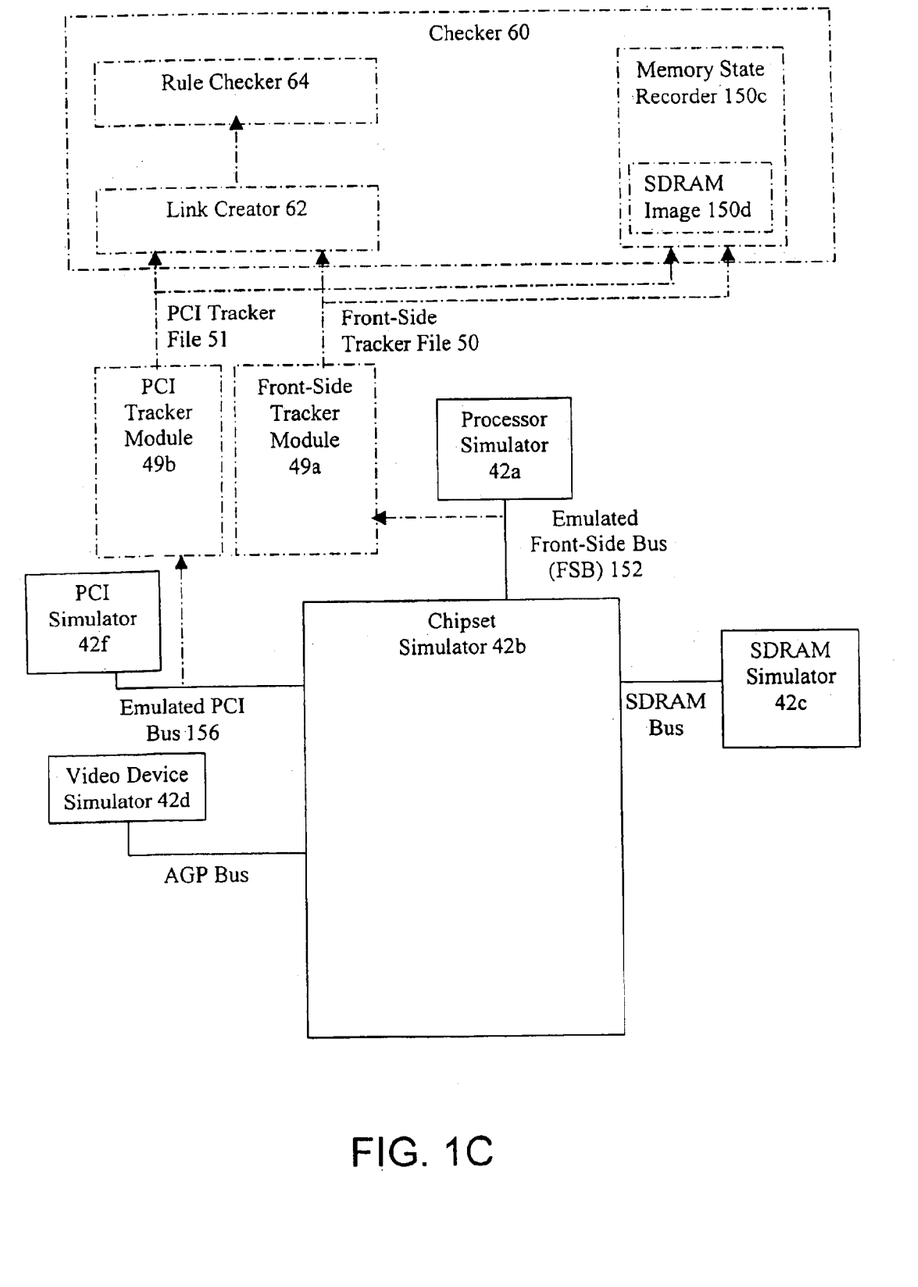
FIG. 1C is a block diagram of the checker, simulation modules, and tracker modules of FIG. 1B.

Referring to FIG. 1C, the simulation modules 48 (FIG. 1B) include a processor simulator 42a, a chipset simulator 42b, an SDRAM simulator 42c, a video device simulator 42d, and a PCI simulator 42f. The PCI simulator may simulate multiple PCI devices 18 plugged into slots 22 of the PCI Bus 26 (FIG. 1A). Simulator modules for standard devices such as SDRAM simulator 42c, video device simulator 42d, and PCI simulator 42f are well known in the art. The chipset simulator 42b is written in a computer programming language, such as Very High Speed Integrated Circuit Hardware Description Language (VHDL) or Verilog, to capture the preferred design of the chipset 20. The chipset simulator 42b may later be compiled, for example, using a VHDL compiler to produce a transistor layout for fabricating the chipset 20.

The processor simulator 42a and the chipset simulator 42b communicate with each other, thereby emulating a front-side bus 152. A front-side bus tracker module 49a collects event information from the emulated front-side bus 152 to create a front-side bus tracker file 50. The chipset simulator 42b also communicates with the PCI simulator 42f, thereby emulating a PCI bus 156. A PCI tracker module 49*b* collects event information from the emulated PCI bus 156 to create a PCI tracker file 51.

A memory state recorder module 150*c* observes the communications on the emulated PCI bus 156 and the emulated front-side bus 152 and maintains an SDRAM image 150*d* of what the contents of the different memory locations in the SDRAM simulator should be if the chipset 20 is operating correctly. For example, if the memory state recorder module detects a command to write to a specific SDRAM memory location on the buses 152, 156, the memory state recorder module 150*c* updates a memory location in the SDRAM image 150*d* corresponding to the specific memory location thereby maintaining an image of what the contents of the SDRAM simulator 42*c* should be. Unlike SDRAM simulator 42*c*, SDRAM image 150*d* is not maintained by the chipset and can therefore be used to check that chipset simulator 42*b* is correctly interacting with SDRAM simulator 42*c*.

A checker 60 determines whether the chipset simulator 42*b* is operating correctly by analyzing the SDRAM image 150*d*, PCI tracker file 51, and the front-side bus tracker file 50. The checker 60 includes a link creator 62 which creates links between the events contained within the tracker files 50, 51 based on a predefined set of event relationships, as will be described later. The link creator 62 also annotates the events with certain information or annotations. A rule checker 64 checks whether the chipset simulator 42*b* meets certain design requirements, which are represented by a set of rules. The rule checker may apply the rules against any combination of the annotations, and links from the link creator and data from the tracker files.

Figures 2A, 2B:
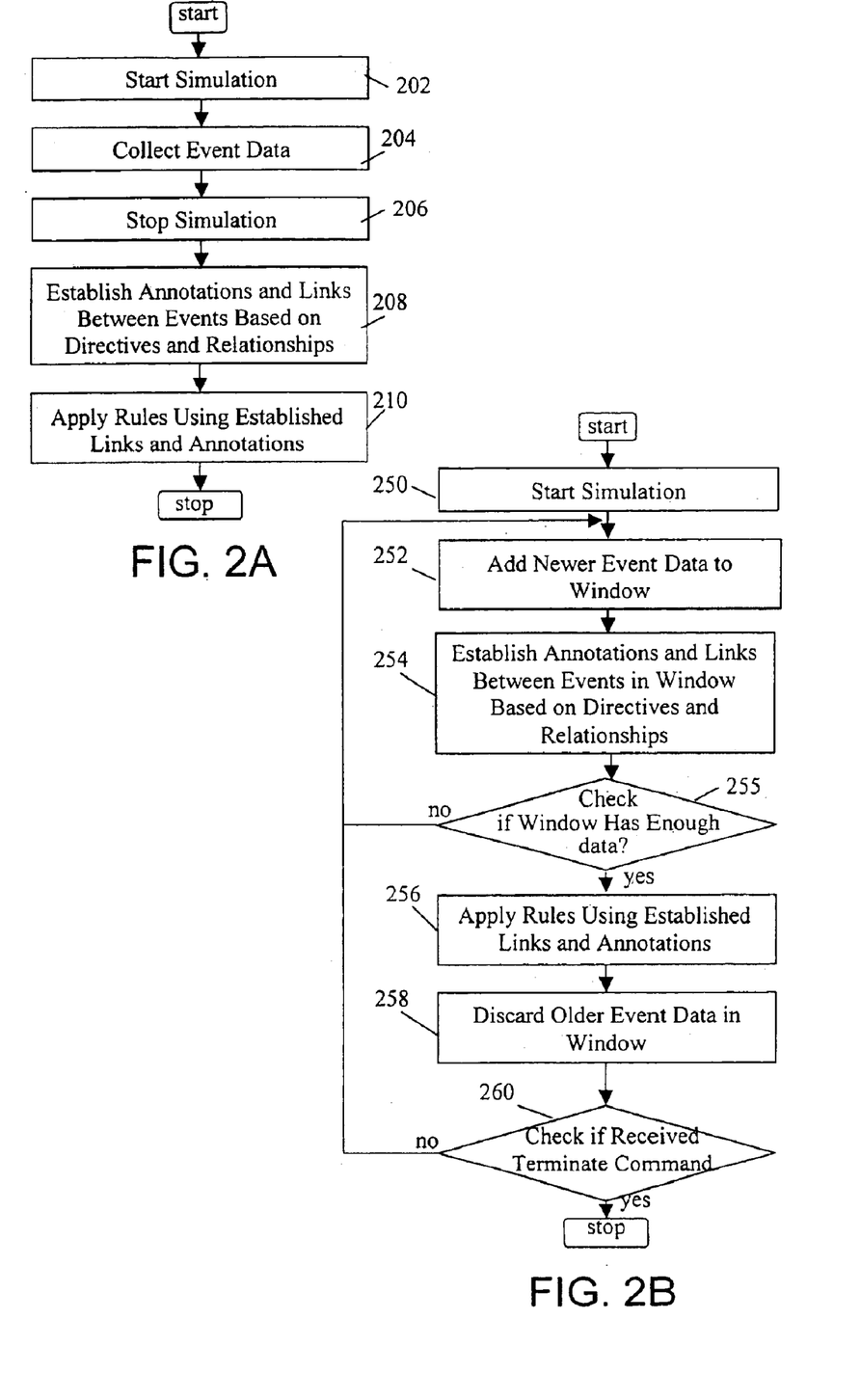
FIG. 2A is a flow chart of the process of checking the chipset of FIG. 1A.
FIG. 2B is a flow chart of an alternative process of checking the chipset of FIG. 1A.

Referring to FIG. 2A, the process for checking a simulated chipset begins when the simulation system 40 (FIG. 1B) is started 202. The tracker modules 49 (FIG. 1B) collect 204 event data while the simulation is running to create tracker files. The simulation is stopped 206 and the link creator 62 (FIG. 1C) establishes 208 annotations and links between events from the tracker files based on a predefined set of directives and relationships (described in greater detail below). The rule checker 64 (FIG. 1C) then applies 210 a predefined set of rules to data from the link creator and the tracker files to determine whether the events comply with a set of rules, thereby determining whether the simulated chipset 42*b* is operating properly.

Referring to FIG. 2B, an alternate process for checking a chipset establishes annotations and links between events and applies rules on a small window of events, thereby allowing the alternate process to check events while the simulation is running i.e., in real time. The alternate process also begins when the simulation system 40 is started 250. The checker adds 252 new event data into an event window containing a subset of the event data from the tracker files. The link creator 62 (FIG 1C) establishes 254 annotations and links between events in the event window based on the predefined set of directives and relationships (described in greater detail below).

The checker then checks 255 whether the event window contains enough event data to check every one of the event rules. For example, if the longest sequence of events required to check a rule is 10 events, the window must contain at least 10 events. The number of events that must be contained within the window is referred to as the window width and may be set by specifying the time required to generate the required number of events, i.e., a window width time is selected to be greater than or equal to the greatest possible simulation time between two related events.

If the event window does not contain enough data, the checker adds 252 more data to the event window. Otherwise, the rule checker 64 (FIG. 1C) then applies 256 a predefined set of rules to the information from the link creator and the tracker files to determine whether the events comply with the rules. The process then discards 258 older event data within the event window, thereby freeing processing resources, such as memory 41 or storage 46, used to process the older event data. The process then checks 260 whether it has received a command to terminate the testing. If it has not, then the process adds 252 newer event data from the simulation system 40 to the event window and proceeds to establish 254 annotations and links between events in the event window, as described above. Otherwise, if the process has received a command to terminate, the process stops.

By discarding 258 older event data to free resources 41, 46 for newer event data, the alternate process can check events from longer simulations. The longer simulations may be more effective at identifying certain chipset defects. The alternate process may also be used to run the checker on data collected from a simulation after the simulation is done.

I. Collecting Event Data

Figure 3:
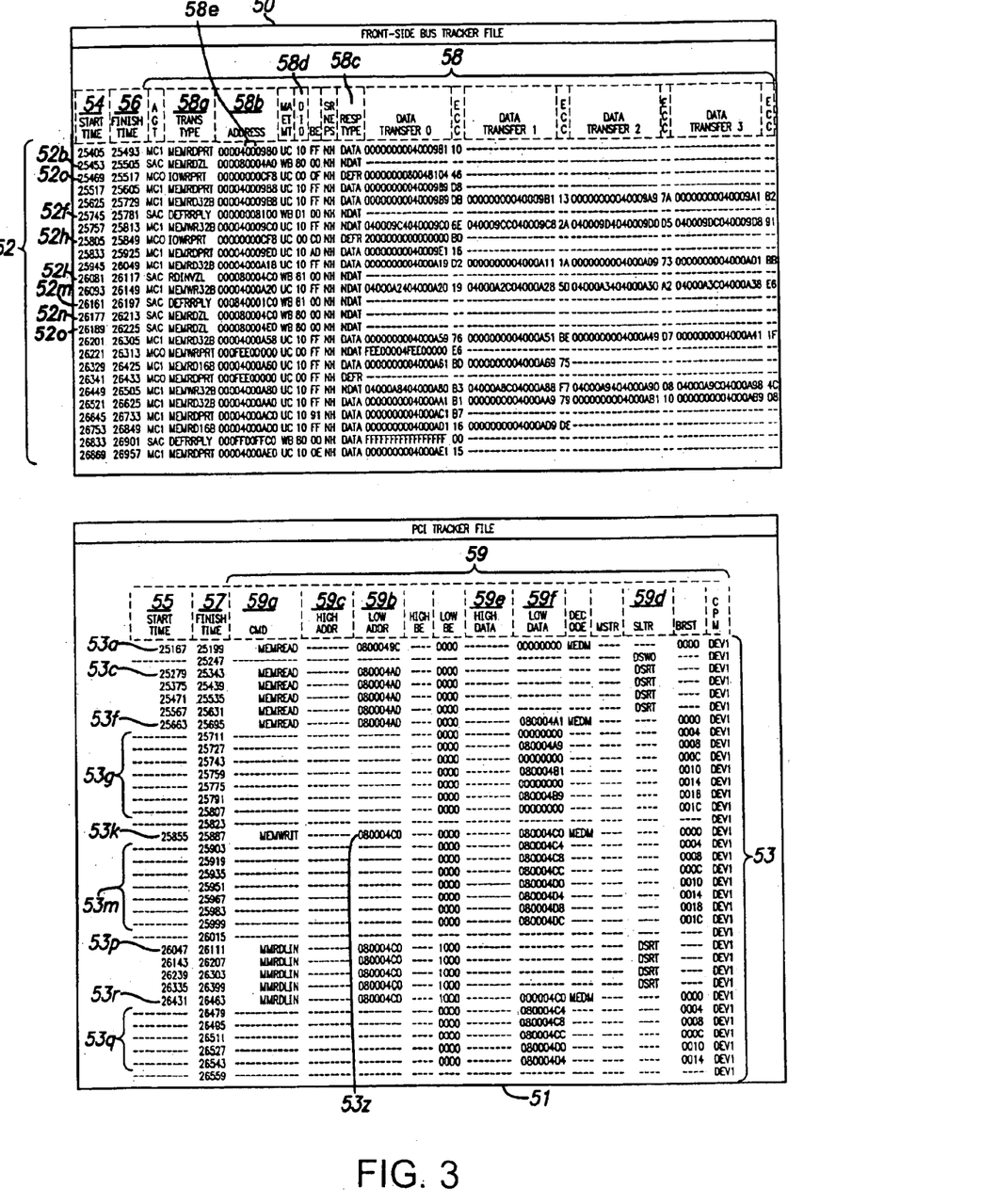
FIG. 3 shows excerpts from tracker files created by the tracker modules of FIG. 1C.

Referring to FIG. 3, a front-side bus tracker file 50 and a PCI tracker file 51 are used to record the data associated with events on the front-side bus 24, 152 and the PCI bus 26, 156 respectively. Each tracker file contains a series of events 52, 53. Each event 52, 53 may have a start time 54, 55, and a finish time 56, 57, respectively. Additionally, each of the front-side bus events 52 has event data 58 associated with the event, such as a transaction type 58*a* (TRANS TYPE), an address 58*b*, a response type 58*c* (RESP TYPE), and a deferred identifier (DID) 58*d* that is used by events that have a deferred (DEFR) response type 58*c*. Each PCI tracker file also has event data 59 associated with the event, such as a command (CMD) 59*a*, a low address 59*b*, a high address 59*c*, a slave termination type (SLTR) 59*d*, low data 59*f*, high data 59*e*, and so forth.

The memory state recorder module 150*c* (FIG. 1C) observes the events 52 and 53 from the tracker files and uses the events to maintain an SDRAM image 150*d* (FIG. 1C) of what the contents of SDRAM memory should be. For example. MEMWRIT events 53*k*, 53*m* to a specific address 53*z* represent commands to write to memory, which the memory state recorder module 150*c* registers by updating locations in SDRAM image 150*d* corresponding to the specific address, thereby maintaining an image of what the contents of SDRAM should be.

II. Establishing Links and Annotations

Figure 4A:
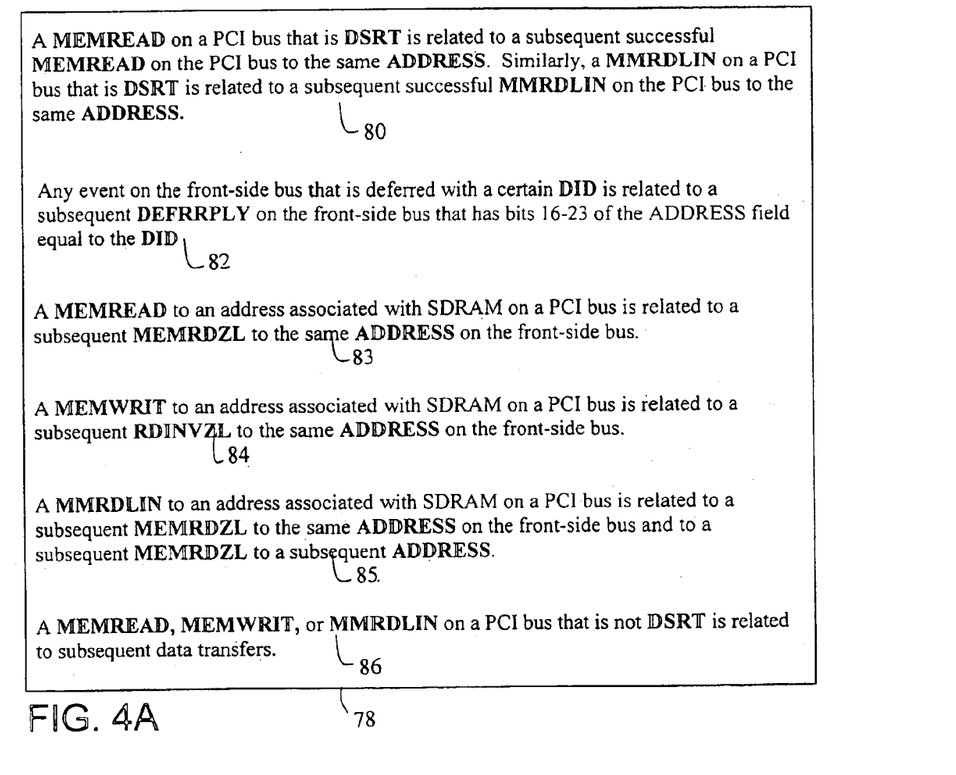
FIG. 4A shows a set of relationships for establishing links between the events contained within the tracker files.

Referring to FIG. 4A, a set 78 of predefined relations for establishing links will be described. The first relation 80 establishes links between events contained within the PCI tracker file 51 (FIG. 3). Relation 80 states that each event associated with a memory read (MEMREAD) command 59*a* (FIG. 3) to a certain address 59*b*, 59*c* (FIG. 3) that results in an SLTR 59*d* (FIG. 3) value of disconnect with retry (DSRT) should be linked to a subsequent event on the PCI bus that also has a MEMREAD command 59*a* (FIG. 3) to the same certain address 59*b*, 59*c* (FIG. 3) and does not have an SLTR 59*d* (FIG. 3) value of disconnect with retry (DSRT). The memory read commands with DSRT correspond to events that were disconnected to be retried later, perhaps because the chipset 20 was too busy to service the memory read command at the requested time. The first relation 80 links the disconnected memory read with a subsequent successful retry of the memory read. Based on relation 80, PCI events 53c and 53f should be linked to each other. Similarly events 53p, 53r should be linked.

The second relation 82 establishes links between events contained within the front-side bus tracker file. Relation 82 states that an event that has a DEFR response type 58c (FIG. 3) with a certain DID 58d (FIG. 3) is related to a subsequent event on the front-side bus that has a DEFRRPLY transaction type 58a (FIG. 3), and has the byte 58e (FIG. 3) of the address equal to the certain DID 58d (FIG. 3). The event with a DEFR response type is a deferred event, while the DEFRRPLY event represents a reply to the deferred event. Relation 82 links a deferred reply to the initial deferred event. Based on relation 82, bus events 52c and 52f are related, and events 52h and 52m are also related.

The third relation 83 establishes links between events contained within the PCI bus tracker file 51 and events in the front-side bus tracker file 50. Relation 83 states that a PCI event that has a MEMREAD command 59a (FIG. 3) to a certain address 59b, 59c (FIG. 3) associated with SDRAM is related to an event on the front-side bus at a subsequent time that has a memory-read-zero-length (MEMRDZL) transaction type 58a (FIG. 3) to the same address 58b as the address of the MEMREAD event 59b, 59c. As previously described, the MEMREAD command represents an attempt to read from a memory address. The MEMRDZL transaction type corresponds to the chipset 20 requesting the processor 10 to update the memory address with a value stored in the processor cache 11, so that the MEMREAD fetches data that is up to date. Relation 83 establishes a link between the two instructions. Based on relation 83, PCI bus event 53c should be linked to front-side bus event 52b.

The fourth relation 84 also establishes links between events contained within the PCI bus tracker file 51 and events in the front-side bus tracker file 50. Relation 84 states that a PCI event that has a MEMWRIT command 59a (FIG. 3) to a certain address 59b, 59c (FIG. 3) associated with SDRAM is related to an event on the front-side bus at a subsequent time that has a RDINVZL transaction type 58a (FIG. 3) to the same address 58b as the address 59b, 59c of the MEMWRIT event. The MEMWRIT transaction type represents an attempt to write to an address 59b, 59c while a RDINVZL corresponds to an instruction from the chipset 20 informing the processor 10 that information stored within the cache 11 corresponding to the address being written to has been invalidated by the write instruction. Relation 84 establishes a link between the two instructions. Based on relation 84, it will be appreciated that PCI bus event 53k should be linked to front-side bus event 52l.

The fifth relation 85 states that a PCI event that has a MMRDLIN command 59a (FIG. 3) to a certain address 59b, 59c (FIG. 3) associated with SDRAM is related to an event on the front-side bus at a subsequent time that has a memory-read-zero-length (MEMRDZL) transaction type 58a (FIG. 3) to the same address 58b as the address of the MMRDLIN event 59b, 59c. The fifth relation 85 also states that the MMRDLIN is also related to a second MEMRDZL event on the front-side bus to a subsequent address 58b to the address of the MMRDLIN event 59b, 59c. The MMRDLIN command represents a command to read from a specific memory address and to prepare to read data at the address after the specific memory address. The first MEMRDZL transaction type corresponds to the chipset 20 requesting the processor 10 to update the memory address with a value stored in the processor cache 11, so that the MEMREAD fetches data that is up to date, while the second MEMRDZL corresponds to the chipset requesting the processor to update the next memory location with the value stored in the processor cache 11. Relation 85 establishes links between the three instructions. Based on relation 85, PCI bus event 53p should be linked to front-side bus events 52n and 52o.

The sixth relation 86 establishes links between events contained within the PCI tracker file 51 (FIG. 3). Relation 86 states that each memory event to a certain address 59b, 59c (FIG. 3) that results in an SLTR 59d (FIG. 3) value that is not disconnect with retry (DSRT) should be linked to subsequent data transfers (i.e. events with an unspecified command type 59a) on the PCI bus. A memory event may have a command 59a (FIG. 3) value of a memory read (MEMREAD), a memory read line (MMRDLIN), or a memory write (MEMWRIT). The memory events without DSRT correspond to successful memory events that may be associated with subsequent data transfers, i.e., events that do not have a command type. Based on relation 86, PCI events 53f and 53g are related to each other. Similarly events 53k and 53m are related to each other, as are events 53r and 53q.

Figure 4B:
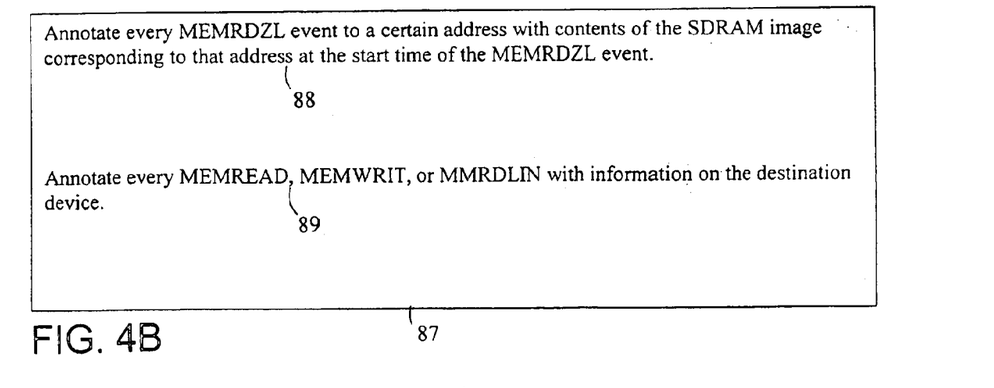
FIG. 4B shows a set of directives for annotating events with information.

Referring to FIG. 4B, a set 87 of directives used by the link creator 62 to annotate the events with information will be described. The annotation information can later be used by multiple rules, thereby avoiding repeatedly generating the annotation information.

The first directive 88 in the set 87 states that every event on the front-side bus with a transaction type 58a (FIG. 3) of MEMRDZL to a specific address 58b should be annotated with the data contained within an address of the SDRAM image 150d (FIG. 1C) corresponding to the specific address at the start time 54 (FIG. 3) of the event. The information is later used to check that the PCI MEMREAD or MMRDLIN event corresponding to the MEMRDZL yields the correct data.

The second directive 89 in the set of directives 87 states that every read or write event oil the PCI bus (i.e. every event with a command 59a of MEMREAD, MEMWRIT, or MMRDLIN) should be annotated with information about the target device. The target device is determined by matching the address 59b, 59c of the event with a table relating different addresses to different devices.

Figure 5:
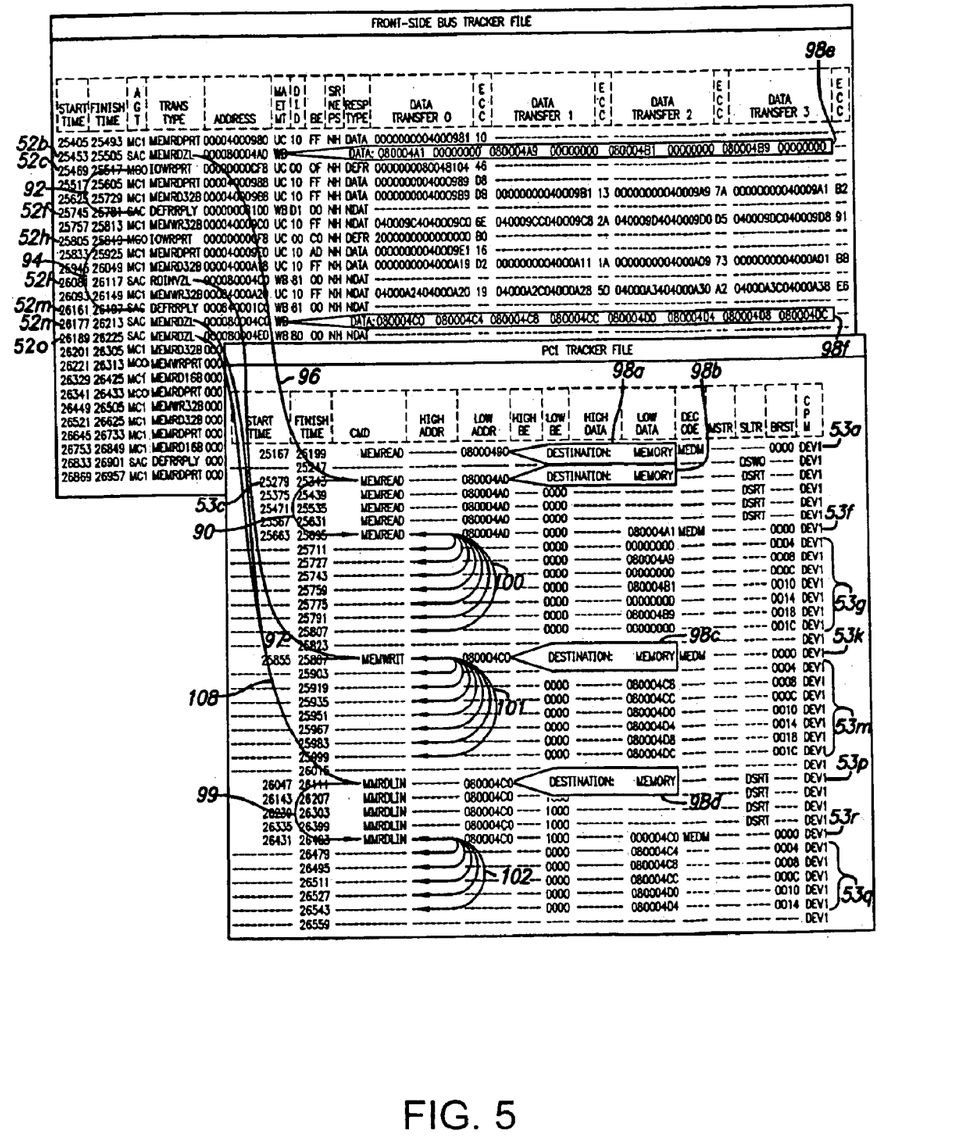
FIG. 5 shows the tracker files of FIG. 3 after the links of FIG. 4A have been established and the information of FIG. 4B has been annotated.

Referring to FIG. 5, the link creator 62 uses known methods to establish annotations and links 90–102, 108 between events based on relations 80–86 and directives 88, 89 as described above. Link 90 links PCI events 53c and 53f to each other based on relation 80. Based on relation 82, link 92 links front-side bus events 52c and 52f to each other and link 94 links front-side bus events 52h and 52m to each other. Similarly, link 96 links PCI bus event 53c to front-side bus event 52b based on relation 83, while link 97 links PCI bus event 53k to front-side bus event 52l based on relation 84. Links 108 link PCI bus event 53p to front-side bus events 52n and 52o based on relation 85. Because of relation 86, links 100 relate PCI events 53f and 53g to each other, links 101 relate PCI events 53k, 53m to each other, while links 102 relate PCI events 53r, 53q to each other. The links indicate relationships between events that may be subject to certain rules.

The link creator makes the annotations and links 90–102, 108 in a first pass before the rule checker 64 uses the annotations and links to apply a set of rules in a second pass (described below). This provides a variety of advantages. For example, when the same link is used by two rules, the link is only established once thereby eliminating the additional processing that would otherwise be required by each of the rules separately identifying the relationship between the linked events.

The link creator 62 also uses the directives 87 (FIG. 4B) to create a set of annotations 98a–98f to the event data that may be used to apply the different rules. The annotations are created once and may be used by multiple rules, thereby avoiding the multiple rules separately deriving the information contained in the annotation. For example, because of the directive 89, the link creator 62 creates the annotations 98a–98d to indicate that the addresses 59b, 59c associated with the events 53a, 53c, 53k and 53p are associated with SDRAM memory 12. Similarly, because of directive 88, link creator 62 creates annotations 98e, 98f which contain the data contained within the address locations 58b associated with the events 52b, 52n.

Figure 6:
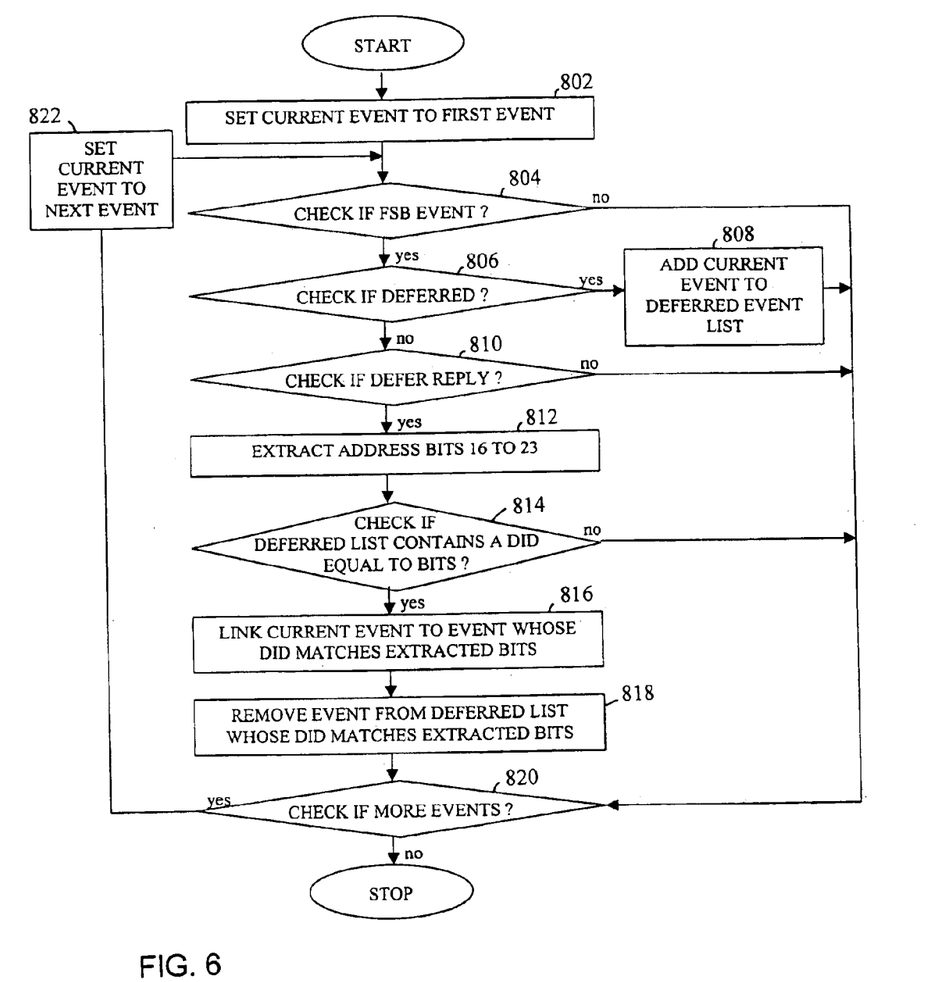
FIG. 6 is a flow chart of a process for establishing links between deferred events and replies to the deferred events.

Referring to FIG. 6, the process for establishing links based on the relationship 82 (FIG. 4A) will be described. The process begins by setting 802 the first event in the tracker files 50,51 (FIG. 3) to be the current event. The process then checks 804 to see if the current event is a front-side bus event 52 (FIG. 3). If the event is not a front-side bus event, the process checks 820 whether there are more events to link and proceeds to link those events.

Otherwise, if the current event is a front-side bus event, the process checks 806 whether the current event is a deferred event, by checking the response type field (RESP TYPE) 58c (FIG. 3). If the current event is a deferred event, the process adds 808 the current event to a list of deferred events that the chipset 20 (FIG. 1A) has not replied to and proceeds to check 820 if there are more events to process. Otherwise the process checks 810 whether the current event is a reply to a deferred event, by checking whether the transaction type 58a (FIG. 3) contains "DEFRRPLY". If the current event is not a reply to a deferred event, the process proceeds to check 820 whether there are more events to process.

Otherwise, if the current event is a reply to a (DEFRRPLY) deferred event, the process extracts 812 the address bits from 16 to 23 (58e in FIG. 3) and checks 814 the list of deferred events to determine whether any of the events in the list have a deferred identifier (DID) 58d (FIG. 3) equal to the extracted bits. If none of the events have a deferred identifier (DID) equal to the extracted bits, the process proceeds to check 820 if there are more events to check. Otherwise, if an event has a deferred identifier (DID) equal to the bits extracted from the current event, the process links 816 the current event to the event with the equal deferred identifier (DID). The process then removes 818 the event with the equal deferred identifier (DID) from the list of deferred events that the chipset 20 (FIG. 1A) has not replied to and checks 820 whether there are more events to link.

If there are no more events to link, the process stops. Otherwise, if there are more events to link, the process sets the next event in the tracker files to be the current event and repeats the process, beginning by checking 804 whether the new current event is a front-side bus event.

III. Applying Rules

Figure 7:
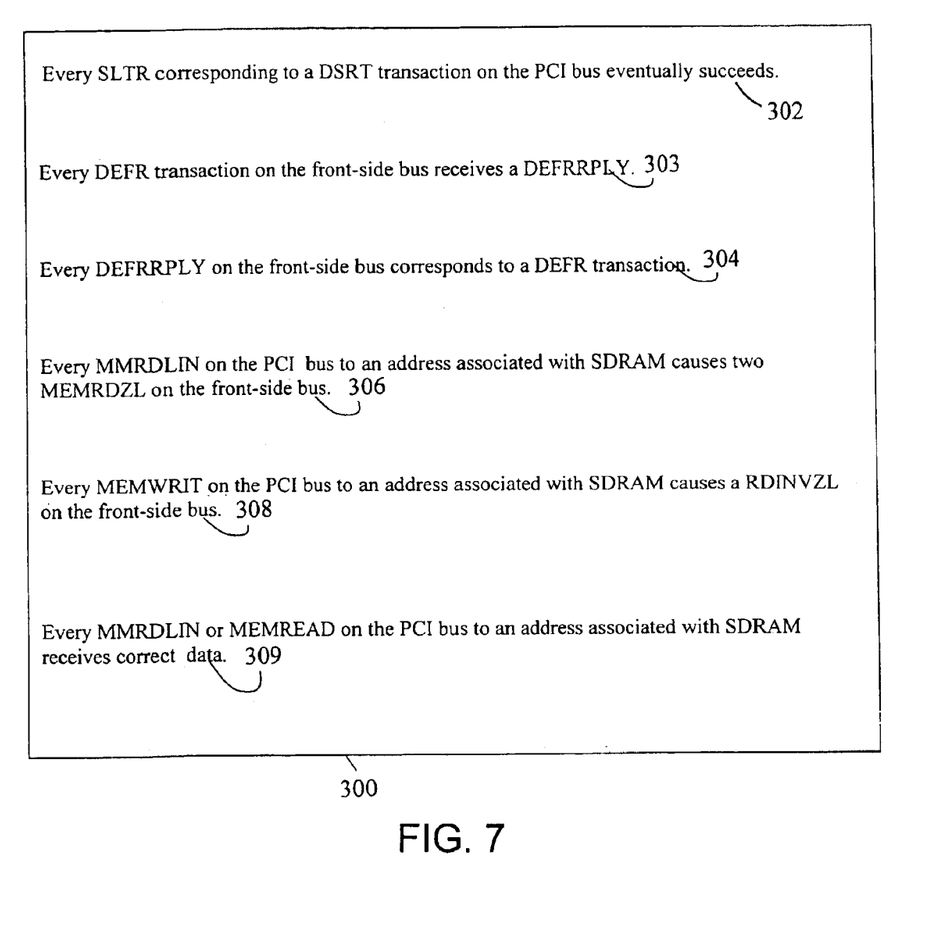
FIG. 7 shows a set of rules for checking the events of FIG. 3.

Referring to FIG. 7, a set of rules 300 against which annotations and links 90–102, 108, and the tracker data in files 50, 51 are checked will be described. The first rule 302 states that every PCI event that has a slave termination type (SLTR) corresponding to disconnection with an instruction to retry the event (DSRT) must eventually succeed. This rule is used to check that the chipset 20 always completes an instruction that is supposed to be retried. It will be appreciated that events 53c, 53f associated with link 90 are subject to the rule 302 because bus event 53c has an SLTR value of DSRT. Checking the events 53c, 53f associated with link 90 against rule 302, bus event 53f successfully retrieves data in the low data column 59f. Consequently events associated with link 90 comply with rule 302.

Rule 303 states that every front-side bus event that has "defer" (DEFR) as a response type is linked to a corresponding event with a defer reply (DEFRRPLY) transaction type. Rule 303 checks to make sure that the chipset 20 responds to every event that it defers. Events 52c, 52f, and 52h, 52m associated with links 92 and 94 are subject to rule 303 because events 52c and 52h have a defer response type. Checking the events 52c, 52f, and 52h, 52m against rule 303, the events comply with the rule because both links include deter reply events 52f, 52m.

Rule 304 states that every reply to a deferred event (DEFRRPLY) on the front-side bus corresponds to a deferred event (DEFR). This rule checks that the chipset 20 does not spuriously generate replies to events that were never deferred. It will be appreciated that rule 304 (like the previously described rule 303) also applies to events 52c, 52f, and 52h, 52m associated with links 92 and 94 and that the events comply with rule 304. By establishing 208, 254 (FIGS. 2A and 2B) the links 92, 94 before applying rules 303, 304, the links are established once and used by the two rules without having to re-establish the relationships between the linked events 52c, 52f, and 52h, 52m for each rule. Thus the process saves processing time.

Rule 306, states that every memory read line (MMRDLIN) on the PCI bus to an address associated with SDRAM causes two MEMRDZL events on the front-side bus, thereby ensuring that the chipset 20 is properly updating memory addresses with information contained within the cache 11 (FIG. 1A) before the memory addresses are read. Events 53p, 52n, and 52o associated with links 108 are subject to this rule as event 53p is a MMRDLIN and has an annotation that states "DESTINATION: memory." Events 53p, 52n, and 52o comply with rule 306. Thus the process can be used to check events involving multiple buses.

Rule 308, states that every memory write on the PCI bus (MEMWRIT) to an address associated with SDRAM causes a RDINVZL event on the front-side bus, thereby ensuring that the chipset 20 is properly informing the processor 10 (FIG. 1A) that a memory address being written to can no longer be read from the processor cache 11 (FIG. 1A). Events 53k, 52l associated with link 97 are subject to this rule as event 53k on the PCI bus is a MEMWRIT event and has an annotation that states "DESTINATION: memory." Because events 53k and 52l are linked to each other, they comply with rule 308.

Rule 309 states that every MMRDLIN or MEMREAD on the PCI bus to an address associated with SDRAM memory receives correct data. Since event 53p has a command value of MMRDLIN and has an annotation that states "DESTINATION: memory," it is subject to this rule. To apply the rule, the rule checker determines the correct data associated with the memory in the MMRDLIN event 53p by reading the annotation 98f associated with the MEMRDZL event 52n, which is associated with the MMRDLIN event 53p by links 108. The rule checker then determines the data that is actually retrieved by the MMRDLIN event 53p by retrieving data 59e. 59f from data transfer events 53q, which are associated to the MMRDLIN event 53p by links 99 and 102. Thus the rule checker may use annotations, links, and tracker data to apply a rule.

Figure 8:
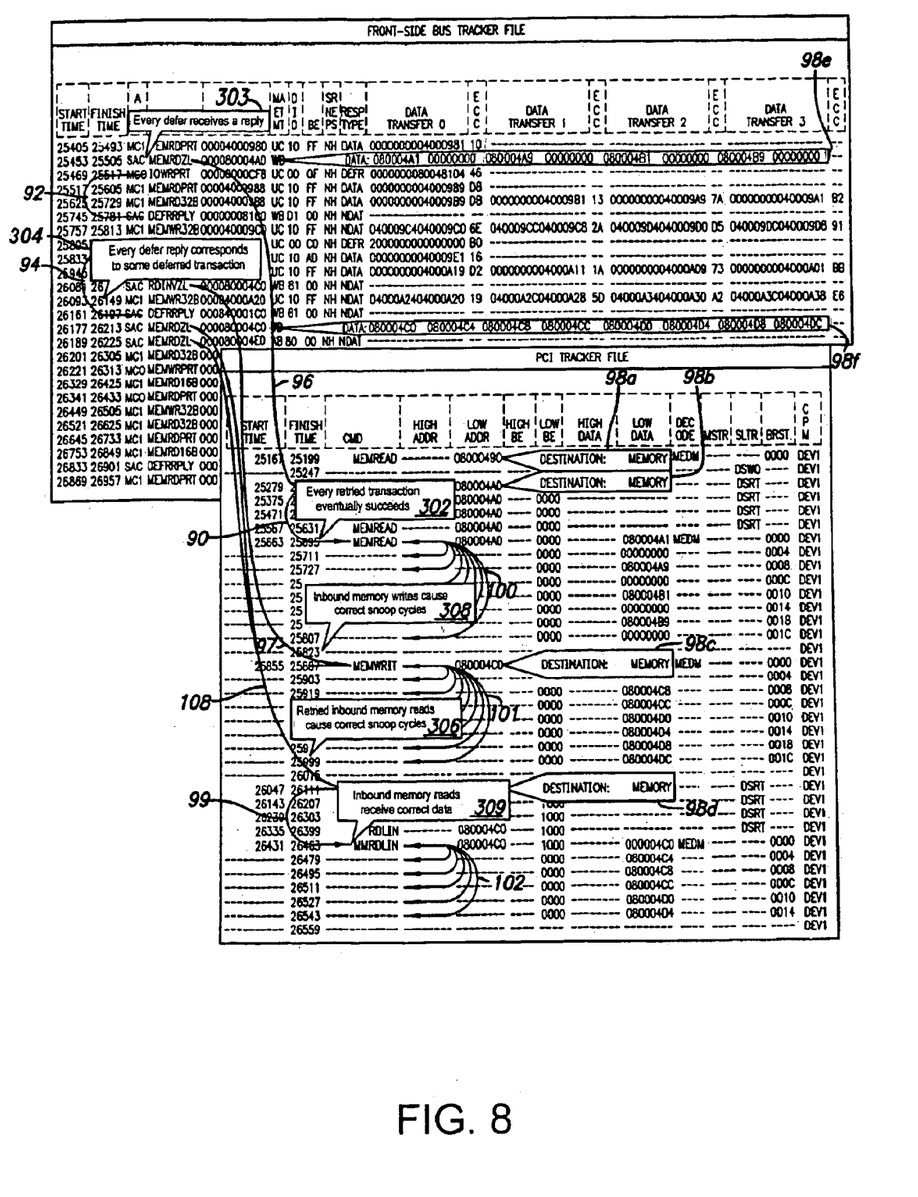
FIG. 8 shows the tracker files of FIG. 5 after the rules of FIG. 7 have been checked against the tracker files.

Referring to FIG. 8, rule checker 64 (FIG. 1C) determines whether the chipset 20 is operating correctly by checking the annotations and links 90–102, 108, and data from the tracker files 51,50. When an event does not comply with a rule, the checker prints a message, for example, to the computer screen or to a log file, indicating that there has been a rule violation. For instance, a printed message may state:

Rule 1234 VIOLATION at front-side bus time 9876.

Incorrect memory read data. The log file may later be used to diagnose the cause of the rule violation.

Thus the checking system checks the proper operation of a chipset in two passes. The first pass establishes annotations and links between related events of interest while the second pass checks the annotated and linked events against a set of rules to determine whether the events comply with the set of rules. A link or annotation may be used by multiple rules, thereby reducing the processing time required.

A number of embodiments of the invention have been described. Nevertheless, it will be understood that various modifications may be made without departing from the spirit and scope of the invention. For example, the two-pass method has been described with reference to tracker files generated by a simulation of a front-side bus and a PCI bus of a computer system, however the two-pass method may be applied to many different systems. For instance, the method may be applied to tracker files from the AGP bus or from the memory bus or to the front-side bus and an internal bus (not shown) of the processor 10. In other applications, the two-pass method may be used with other state recorders besides the memory state recorder described above. For example, the checker may be used with a cache state recorder to record the state of cache locations within the processor.

The tracker data need not be stored in files. The tracker data could be provided to the checker by the tracker module through any inter-process communication method, such as pipes or sockets. Alternatively, the checker could be part of the same process as the simulation being tested. The tracker data need not be collected from a computer simulation. The data may be collected from an actual computer system.

The two-pass method may be used to check devices other than chipset 20. For example, it may be used to check any other device, such as a computer processor. It may also be used to check processes that are unrelated to devices that produce a time ordered sequence of events. For example, the method may be applied to different software modules that communicate with each other, for example, using signals or semaphores.

The two-pass method may be used with rules that perform other functions besides checking whether a device is operating correctly. For example, the rules may compile statistical data, such as the average time required to complete a certain kind of transaction on the bus.

In the alternate embodiment where the link creator and the rule checker process check the events while the simulator is running, the link creator and the rule checker may process the events in a burst and then switch to an idle mode, while waiting for the simulation to add more event data to the tracker files. The link creator may lead the rule checker in processing events to ensure that links are established before rules are applied to the events. For example, if checking a rule requires a sequence of ten events, the link creator must lead the rule checker by at least ten events.

Accordingly, other embodiments are within the scope of the following claims.

What is claimed is:

1. A method comprising:

in an earlier pass through a time-ordered sequence of input events to a device and output events generated by the device, establishing links between events selected from the sequence based on predefined event relationships, at least one of the links being between an input event and an output event; and in a later pass through the events, checking whether the events comply with a set of rules based on the links, the earlier pass and the later pass being concurrent and the earlier pass leading the later pass in the sequence of events.

2. The method of claim 1, wherein the set of rules includes a first and a second rule, checking whether the events comply with the first rule being based on a first link and checking whether the events comply with the second rule being also based on the first link.

3. The method of claim 1, wherein a time-ordered sequence of events of a given length is required to check whether events comply with the set of rules, the earlier pass leading the later pass by at least the given length to ensure that the links are established in the sequence before checking whether events in the sequence comply with the set of rules.

4. The method of claim 3, wherein the given length is specified as a separation in time between a first event in the given length and a last event in the given length.

5. The method of claim 1, further comprising, prior to the earlier pass:

collecting event data associated with the events, checking whether the events comply with the set of rules being further based on the event data.

6. The method of claim 1, further comprising, prior to checking whether the events comply with the set of rules:

annotating at least one of the events with information, checking whether the events comply with the set of rules being further based on the information.

7. The method of claim 6, wherein the set of rules includes a first and a second rule, checking whether the events comply with the first rule being based on a first annotation and checking whether the events comply with the second rule being also based on the first annotation.

8. The method of claim 1, further comprising:

prior to checking whether the events comply with the set of rules, recording a state associated with the device, checking whether the events comply with the rules being further based on the state associated with the device.

9. An article comprising a computer-readable medium which stores computer-executable instructions causing a computer to:

establish links between events based on predefined event relationships, in an earlier pass through a set of input events to a device and output events generated by the device, the links established between events selected from a time-ordered sequence of events, at least one of the links being between an input event and an output event; and check whether the events comply with a set of rules based on the links, in a later pass, the earlier pass and the later pass being concurrent and the earlier pass leading the later pass in the sequence of events.

10. The article of claim 9, wherein the set of rules includes a first and a second rule, checking whether the events comply with the first rule being based on a first link and checking whether the events comply with the second rule being also based on the first link.

11. The article of claim 9, wherein a time-ordered sequence of events of a given length is required to check whether events comply with the set of rules, the earlier pass leading the later pass by at least thee given length to ensure that the links are established in the sequence before checking whether events in the sequence comply with the set of rules.

12. The article of claim 11, wherein the given length is specified as a separation in time between a first event in the given length and a last event in the given length.

13. The article of claim 9, wherein the instructions further cause the computer, prior to the earlier pass, to:

collect event data associated with the events, checking whether the events comply with the set of rules being further based on the event data.

14. The article of claim 9, wherein the instructions further cause the computer, prior to checking whether the events comply with the set of rules, to:

annotate at least one of the events with information, checking whether the events comply with the set of rules being further based on the information.

15. The article of claim 14, wherein the set of rules includes a first and a second rule, checking whether the events comply with the first rule being based on a first annotation and checking whether the events comply with the second rule being also based on the first annotation.

16. The article of claim 9, wherein the instructions further cause the computer to:

prior to checking whether the events comply with the set of rules, record a state associated with the device, checking whether the events comply with the rules being further based on the state associated with the device.

17. An apparatus comprising:

a memory which stores computer-readable instructions;

a processor which executes the computer-readable instructions to check input events to a device and output events generated by the device, by:

in an earlier pass through the input and output events, establishing links between the input and output events based on predefined event relationships, the links established between events selected from a time-ordered sequence of events; and in a later pass through the input and output events, checking whether the input and output events comply with a set of rules based on the links, the earlier pass and the later pass being concurrent and the earlier pass leading the later pass in the sequence of events.

18. The apparatus of claim 17, wherein the set of rules includes a first and a second rule, checking whether the events comply with the first rule being based on a first link and checking whether the events comply with the second rule being also based on the first link.

19. The apparatus of claim 17, wherein a time-ordered sequence of events of a given length is required to check whether events comply with the set of rules, the earlier pass leading the later pass by at least the given length to ensure that the links are established in the sequence before checking whether events in the sequence comply with the set of rules.

20. The apparatus of claim 19, wherein the given length is specified as a separation in time between a first event in the given length and a last event in the given length.

21. The apparatus of claim 17, wherein checking the events further includes, prior to the earlier pass:

collecting event data associated with the events, checking whether the events comply with the set of rules being further based on the event data.

22. The apparatus of claim 17, wherein checking the events further includes, prior to checking whether the events comply with the set of rules:

annotating at least one of the events with information, checking whether the events comply with the set of rules being further based on the information.

23. The apparatus of claim 22, wherein the set of rules includes ax first and a second rule, checking whether the events comply with the first rule being based on a first annotation and checking whether the events comply with the second rule being also based on the first annotation.

24. The apparatus of claim 17, wherein checking the events further comprises:

prior to checking whether the events comply with the set of rules, recording a state associated with the device, checking whether the events comply with the rules being further based on the state associated with the device.

* * * * *

UNITED STATES PATENT AND TRADEMARK OFFICE
CERTIFICATE OF CORRECTION

PATENT NO.    : 6,751,752 B1
DATED         : June 15, 2004
INVENTOR(S)   : Michael D. Smith It is certified that error appears in the above-identified patent and that said Letters Patent is hereby corrected as shown below:

Column 1,
Line 56, semicolon at end of sentence "...against the tracker files" should be replaced by a period.

Column 3,
Line 29, need quotation marks around "against".
Line 49, need comma after the word "running".
Line 53, need period after the word "FIG".

Column 4,
Line 43, period after the word "example" should be replaced by a comma.
Line 43, figure number "531k" is incorrect; should be -- 53k -- instead Column 5,
Line 49, figure number "521" is incorrect; should be -- 52$l$ -- instead, i.e., replace number 1 with lower-case letter L.

Column 6,
Line 35, word "oil" should be replaced by -- on --.
Line 50, figure number "521" is incorrect; should be -- 52l -- instead, i.e., replace number 1 with lower-case letter L.
Line 53, need space between figure number "53f" and word "and".

Column 8,
Line 15, word "deter" should be replaced by -- defer --.
Line 29, remove comma after "306".
Line 40, remove comma after "308".
Line 46, figure "521" is incorrect; should be -- 52l -- instead, i.e., replace number 1 with lower-case letter L.
Line 49, figure "521" is incorrect; should be -- 52l -- instead, i.e., replace number 1 with lower-case letter L.
Line 62, period after "59e" should be replaced by a comma.

Column 9,
Line 7, need carriage return after "read data", i.e., next sentence "The log file..." is not part of the message, and was intended to start on a new line.

Column 11,
Line 1, word "thee" should be replaced by -- the --.

UNITED STATES PATENT AND TRADEMARK OFFICE
CERTIFICATE OF CORRECTION

PATENT NO. : 6,751,752 B1
DATED : June 15, 2004
INVENTOR(S) : Michael D. Smith It is certified that error appears in the above-identified patent and that said Letters Patent is hereby corrected as shown below:

<u>Column 12,</u>
Line 30, word "ax" should be replaced by -- a --.

Signed and Sealed this

Twenty-second Day of March, 2005

JON W. DUDAS
*Director of the United States Patent and Trademark Office*